US009058866B2

(12) United States Patent
Freiburger et al.

(10) Patent No.: US 9,058,866 B2
(45) Date of Patent: Jun. 16, 2015

(54) SRAM LOCAL EVALUATION LOGIC FOR COLUMN SELECTION

(75) Inventors: Peter T. Freiburger, Rochester, MN (US); Travis R. Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 13/598,787

(22) Filed: Aug. 30, 2012

(65) Prior Publication Data
US 2014/0063916 A1 Mar. 6, 2014

(51) Int. Cl.
*G11C 11/00* (2006.01)
(52) U.S. Cl.
CPC .................... *G11C 11/00* (2013.01)
(58) Field of Classification Search
USPC ............. 365/154, 202, 203, 49.1, 49.17
See application file for complete search history.

(56) References Cited

U.S. PATENT DOCUMENTS

| 6,209,123 | B1 * | 3/2001 | Maziasz et al. ............... 716/123 |
| 6,522,565 | B2 * | 2/2003 | Shimazaki et al. ............. 365/63 |
| 6,657,886 | B1 | 12/2003 | Adams et al. |
| 7,102,944 | B1 | 9/2006 | Bunce et al. |
| 7,505,340 | B1 | 3/2009 | Adams et al. |
| 7,701,801 | B2 | 4/2010 | Joshi et al. |
| 7,715,221 | B2 | 5/2010 | Christensen et al. |
| 7,724,585 | B2 | 5/2010 | Behrends et al. |
| 7,724,586 | B2 | 5/2010 | Adams et al. |
| 2008/0298137 | A1 | 12/2008 | Chan et al. |
| 2011/0292748 | A1 | 12/2011 | Adams et al. |
| 2014/0063986 | A1 * | 3/2014 | Freiburger et al. ...... 365/189.14 |

OTHER PUBLICATIONS

Chang et al., "An 8T-SRAM for Variability Tolerance and Low-Voltage Operation in High-Performance Caches", IEEE Journal of Solid-State Circuits, pp. 956-963, vol. 43, No. 4, Apr. 2008.
Joshi et al., "A High Performance 2.4 Mb L1 and L2 Cache Compatible 45nm SRAM with Yield Improvement Capabilities", 2008 Symposium on VLSI Circuits Digest of Technical Papers, pp. 208-209, © 2008 IEEE.
Park et al., "Column-Selection-Enabled 8T SRAM Array with ~1R/1W Multi-Port Operation for DVFS-Enabled Processors", 2011 International Symposium on Low Power Electronics and Design (ISLPED), Aug. 1-3, 2011, pp. 303-308.

* cited by examiner

*Primary Examiner* — Thao H Bui
(74) *Attorney, Agent, or Firm* — Peder M. Jacobson; Robert R. Williams

(57) ABSTRACT

An SRAM includes a first SRAM column having first SRAM cells and a first local evaluation logic coupled to a global bit line and a second SRAM column having second SRAM cells and a second local evaluation logic coupled to the same global bit line. The first SRAM column is selected with a first column select line and the second SRAM column is selected with a second column select line.

4 Claims, 5 Drawing Sheets

FIG. 1 – Prior Art

SRAM LOCAL EVALUATION LOGIC FOR COLUMN SELECTION

TECHNICAL FIELD

The present invention relates to a column selection in a static random-access memory (SRAM). In particular, it relates to performing an SRAM column selection using a column select line and a shared global bit line.

BACKGROUND

SRAMs may be arranged in a domino-logic structure using a local bit line coupled to a number of SRAM cells and a global bit line that may be discharged when the local bit line is discharged. The bit lines in a domino SRAM are precharged high and may be discharged to ground, or "pulled down." SRAM cells are connected in parallel to a read/write/precharge circuit through the local bit lines to form a column. The local bit lines are precharged by the read/write/precharge circuit and discharged by the selected cell during a read. A local bit line is coupled to a transistor which may discharge the global bit line. For multiple columns there is typically one global bit line per column. The global bit lines feed into a multiplexer, which receives a column address signal and selects the appropriate global bit line for the column selected. In order for the circuit to function, the global bit line must be precharged.

FIG. 1 is a schematic representation of a portion of a prior art SRAM circuit 100 having two columns 103A and 103B, two global bit lines 111A and 111B, and a multiplexer 113. SRAM cells 101 are connected to a read/write/precharge circuit 102 through a local bit line true 105 and a local bit line complement 104. The local bit line true 105 and the local bit line complement 104 are precharged by a local bit line precharge line 110 and transistors 1P1 and 1P2. A write true line 108 and its associated transistors 1N4 and 1N5, a write complement line 107 and its associated transistors 1N3 and 1N6, and a write enable line 109 and its associated transistor 1N7 control the write operations of a cell 101. The column A global bit line 111A and the column B global bit line 111B are precharged by a global bit line precharge line 115 and transistors 1P3 and 1P4.

As an illustration, to read a "zero" from a cell 101 in column A 103A, a word line 106 turns on pass transistors 1N1 and 1N2. When the "zero" is read, the local bit line true 105 is pulled down while the local bit line complement 104 remains high. The value on the local bit line true is inverted to a "one" by an inverter 116 and turns on a transistor 1N8, which pulls down the precharged column A global bit line 111A. The precharged column B global bit line 111B remains high. A column address select 112 controls a multiplexer 113, which selects a global bit line to output to a data out line 114. The column address select 112 selects global bit line column A 111A, and the "zero" outputs to the data out line 114. The global bit line column A 111A is subsequently precharged for a next operation. This read operation requires one global bit line per column, each requiring precharging.

SUMMARY

In an embodiment of the invention, an SRAM includes a first SRAM column having first cells and a first local evaluation logic coupled to a global bit line and a second SRAM column having second cells and a second local evaluation logic coupled to the same global bit line. The first SRAM column is selected with a first column select line and the second SRAM column is selected with a second column select line.

In another embodiment of the invention, a method for sharing a global bit line between a first column and a second column includes selecting the first column at a first time to drive the global bit line with a first column select line and selecting the second column at a second time to drive the global bit line with a second column select line.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

DETAILED DESCRIPTION

According to embodiments of the invention, a column select may be performed through local evaluation logic in a column to select the column to drive a shared global bit line. An SRAM column may contain local evaluation logic and one or more SRAM cells, each cell storing a "one" or a "zero." The SRAM column may be coupled to a global bit line through a global discharge line. More than two columns may be connected to a single global bit line, but two columns will be referenced herein for exemplary purposes. The local evaluation logic may be coupled to a column select line, which enables the selected column to discharge the global bit line through the local evaluation logic and the global bit line discharge line. One column connected to the global bit line may be selected at a time.

Power and space conservation and reduction are becoming increasingly important as circuit technology advances. Precharging multiple bit lines requires energy and resources. Decreasing wiring congestion and power consumption may enable higher density chips with less power consumption. Utilizing a column select line with a common global bit line eliminates a need for a separate global bit line per column. By reducing the number of global bit lines, the energy required to precharge the global bit lines is reduced. Additionally, using column select signals enables both column selects to be off during a write. Ordinarily, a write operation may discharge a global bit line, depending on the value written to a selected cell. By isolating the global bit line from discharge, the global bit line may not be unnecessarily discharged.

Figure 1:
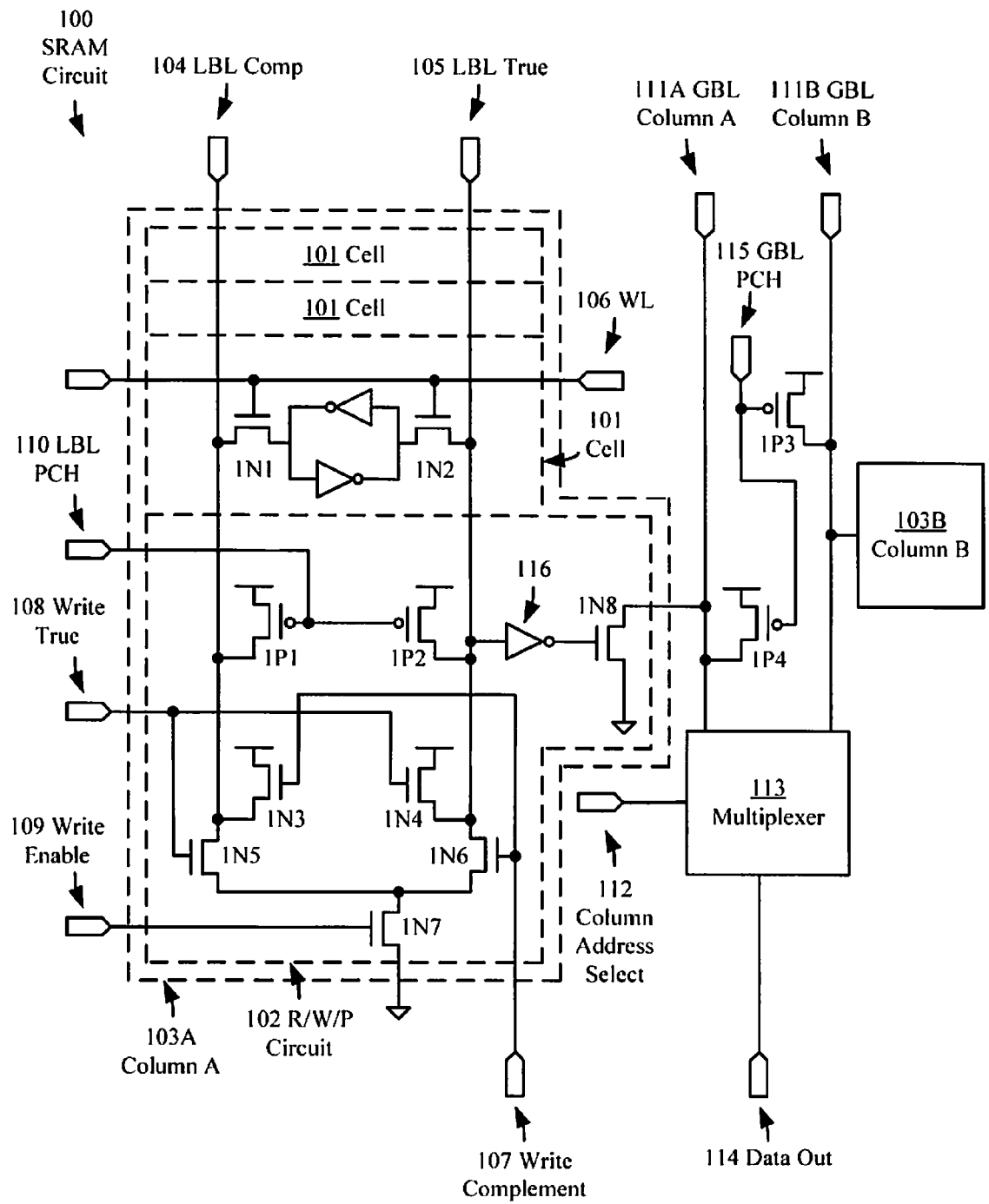
FIG. 1 is a schematic representation of a portion of a prior art SRAM circuit having one global bit line per column, where the desired column is selected with a multiplexer.
Figure 2:
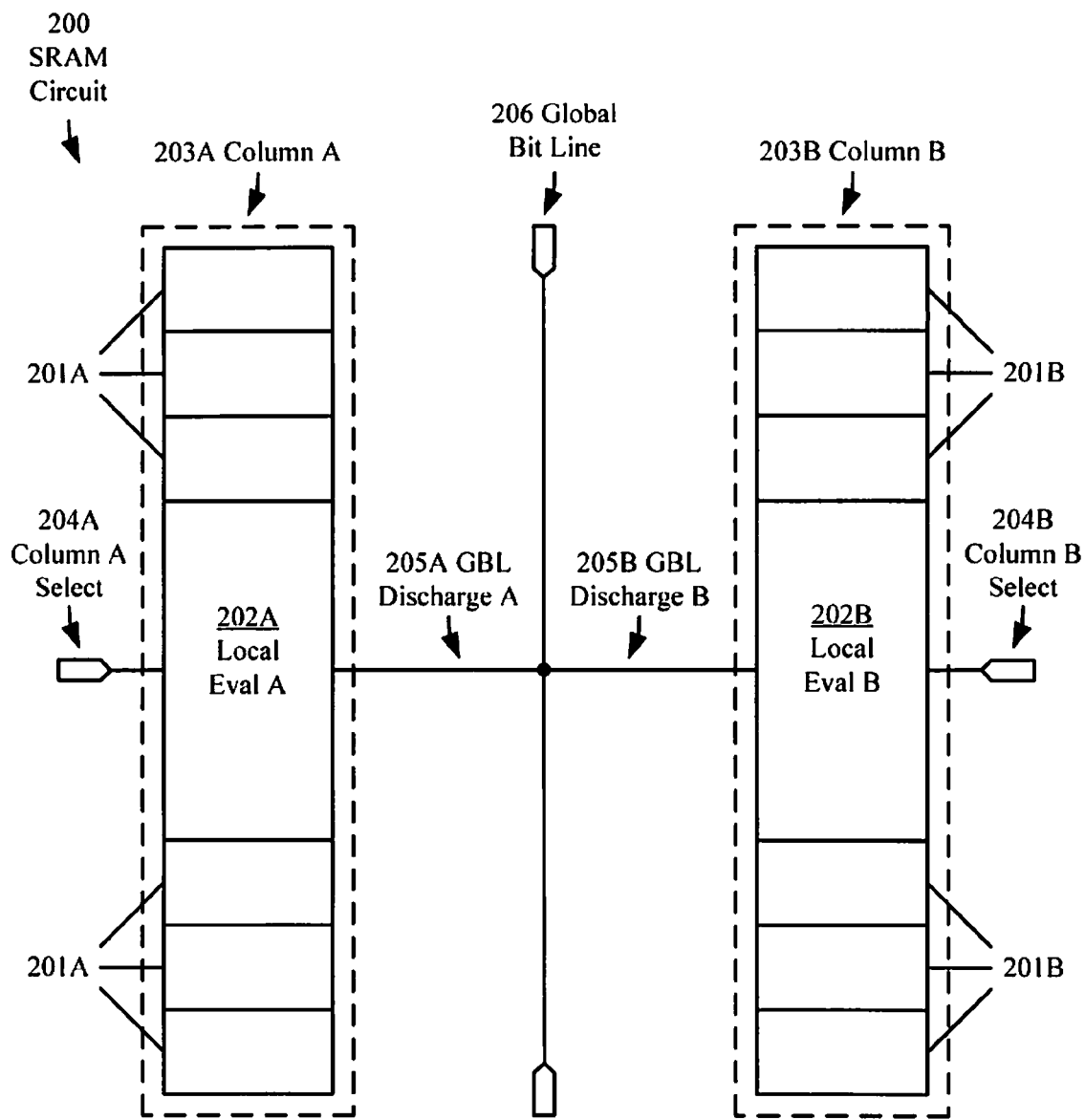
FIG. 2 is a diagrammatic representation of a portion of an SRAM circuit having a column select line in a local evaluation logic and two columns sharing a global bit line, according to embodiments of the invention.

FIG. 2 is a diagrammatic representation of a portion of an SRAM circuit having a column select line coupled to local evaluation logic and two columns sharing a global bit line, according to embodiments of the invention. It will be understood that letters A and B have been appended to items to clearly reference a "left" item (e.g., column A 203A) or a "right" item (e.g., column B 203B) for purposes of explanation only. Such items may be generically referenced as "column 203."

An SRAM circuit 200 may contain two or more columns 203 which share a single global bit line 206. A column 203 may have a plurality of groups of SRAM cells 201 and local evaluation logic 202. A global bit line discharge line 205 may couple the local evaluation logic 202 to the global bit line 206. If a cell 201 is read, a column select line 204 communicates with the local evaluation logic 202 to select the column 203. The column select line 204 enables the selected global bit line discharge 205 and local evaluation logic 202 to pull down the global bit line 206 during a read of the data on the selected SRAM cell.

In embodiments of the invention, SRAM column selection may be carried out through a column selection operation involving local evaluation logic which includes switches, such as a field effect transistor, operated by a column select line. The column select line and an associated transistor act as a gate between a global bit line and ground. So long as there is no discharge path for the global bit line, the global bit line may not be pulled down. Once the column select line enables a discharge path for the global bit line, the global bit line may be discharged by a column's global bit line discharge transistor. The global bit line discharge transistor may have a switch operated by a local bit line.

Figure 3:
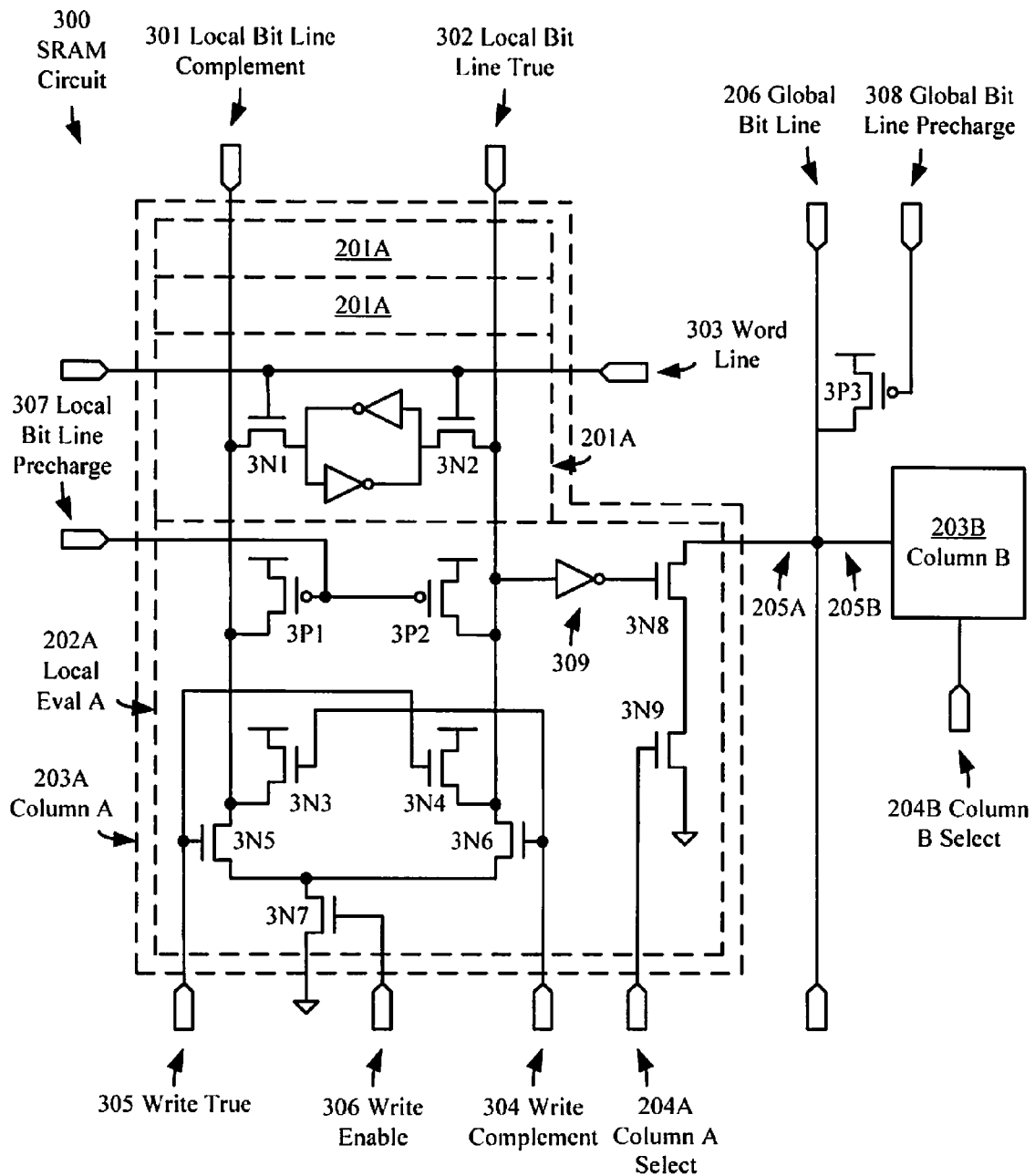
FIG. 3 is a schematic representation of a portion of an SRAM circuit having a column select line to enable a local evaluation logic to drive a shared global bit line, according to an embodiment of the invention.

FIG. 3 is a schematic representation of a portion of an SRAM circuit 300 having a column select line 204 to enable local evaluation logic 202 to drive a shared global bit line 206, according to an embodiment of the invention. A local bit line true 302 and a local bit line complement 301 are precharged by a local bit line precharge line 307 and transistors 3P1 and 3P2. A write true line 305 and its associated transistors 3N4 and 3N5, a write complement line 304 and its associated transistors 3N3 and 3N6, and a write enable line 306 and its associated transistor 3N7 control the read and write operations of a cell 201A. A global bit line 206 is precharged by a global bit line precharge line 308 and a transistor 3P3.

As an illustration, to read a "zero" from a cell 201A in column A 203A, a word line 303 turns on pass transistors 3N1 and 3N2. The local bit line true 302 is pulled down, as a zero is stored on the right node of the cell, while the local bit line complement 301 remains high. The local bit line true 302 is coupled through an inverter 309 to a global bit line discharge transistor 3N8. The low on the input to inverter 309 causes it to output high, which turns on the global bit line discharge transistor 3N8. A column select line 204A for column A 203A turns on a column select transistor 3N9, whose source is coupled to ground and drain is coupled to the source of the global bit line discharge transistor 3N8. With 3N9 and 3N8 turned on, a discharge path is provided through a global bit line discharge line 205A for the precharged global bit line 206 to be pulled down, outputting the "zero" stored in a cell 101A on the global bit line 206. A column B select line 204B may be low during the column select operation, while a global bit line discharge line 205B for column B 203B may be pulled down with the global bit line 206. In another embodiment, the column A select line 204A may be the inverse of the column B select line 204B. A stored "one" may be read in a similar operation as described above.

Figure 4:
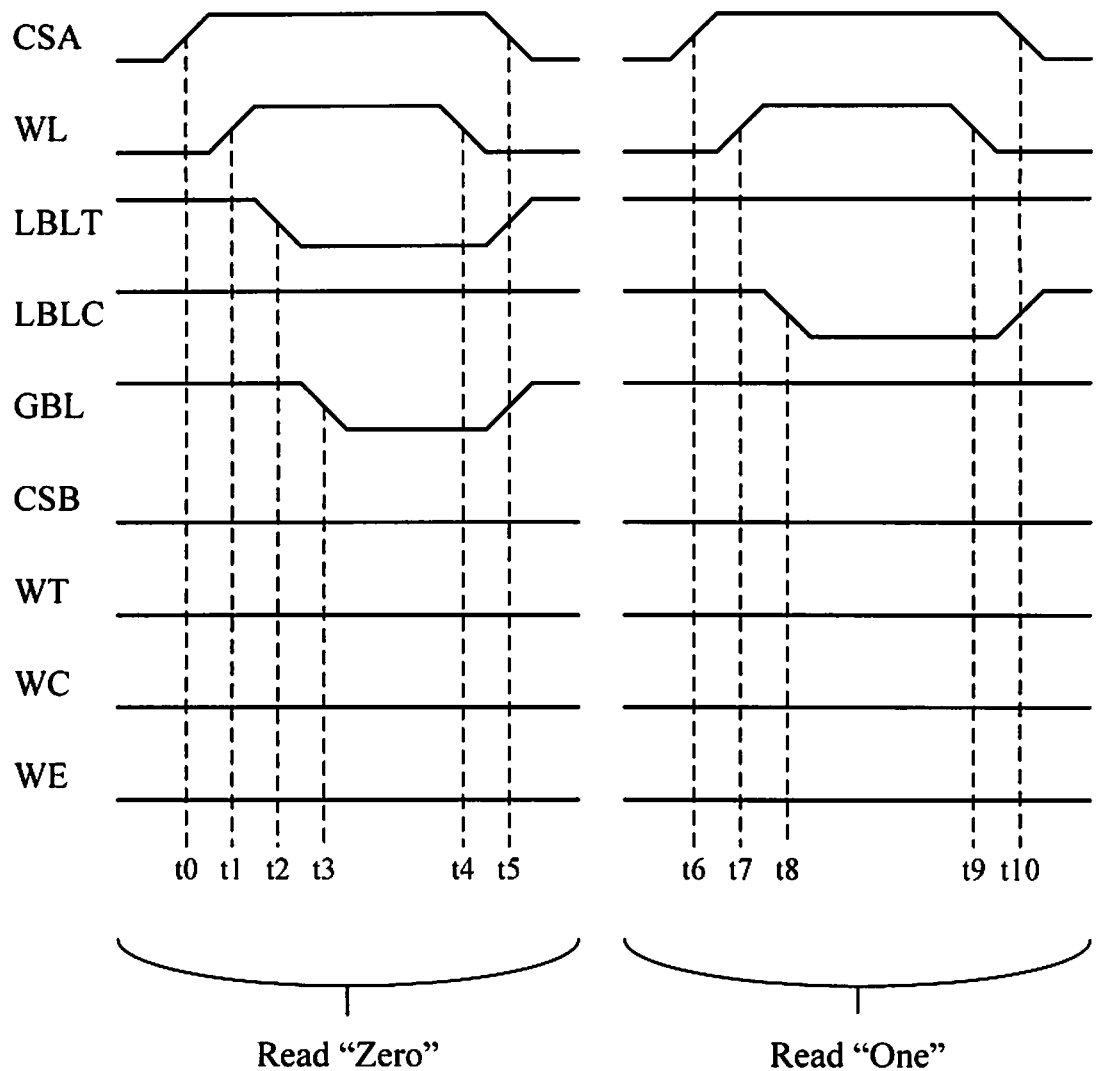
FIG. 4 is a timing diagram of a read operation of an SRAM cell having a "zero" value and a read operation of an SRAM cell having a "one" value, according to embodiments of the invention.

FIG. 4 is a timing diagram of a read operation of an SRAM cell having a "zero" value and an SRAM cell having a "one" value, according to embodiments of the invention. For reading a "zero" from a cell, at t0, a column A select line (CSA) goes high. A wordline (WL) for the cell goes high at t1, opening the cell's pass transistors. A "zero" is stored in the cell, and brings down a local bit line true (LBLT) at t2 while a local bit line complement (LBLC) remains precharged high. At t3 a global bit line (GBL) is pulled down. Once the global bit line is sampled, the wordline goes low at t4, closing the cell's pass transistors. At t5 the local bit line true and the global bit line return to a precharged high, and the column A select line may return low. The write true line (WT) and write complement line (WC) may stay low for the read operation, while the write enable (WE) line may remain low for the read operation. A column B select line (CSB) may remain low for the read operation.

For reading a "one" from a cell, at t6, the column A select line may go high. The wordline for the cell goes high at t7, turning on the cell's pass transistors. A "one" is stored in the cell, and brings down the local bit line complement at t8 while the local bit line true remains precharged high. Once the global bit line is sampled, the wordline goes low at t9, closing the cell's pass transistors. At t10 the local bit line complement returns to a precharged high, and the column A select line may return low. The global bit line and the local bit line true may remain precharged for the read operation. The write true line and write complement line may stay low for the read operation, while the write enable line may remain low for the read operation. The column B select line may remain low for the read operation.

Figure 5:
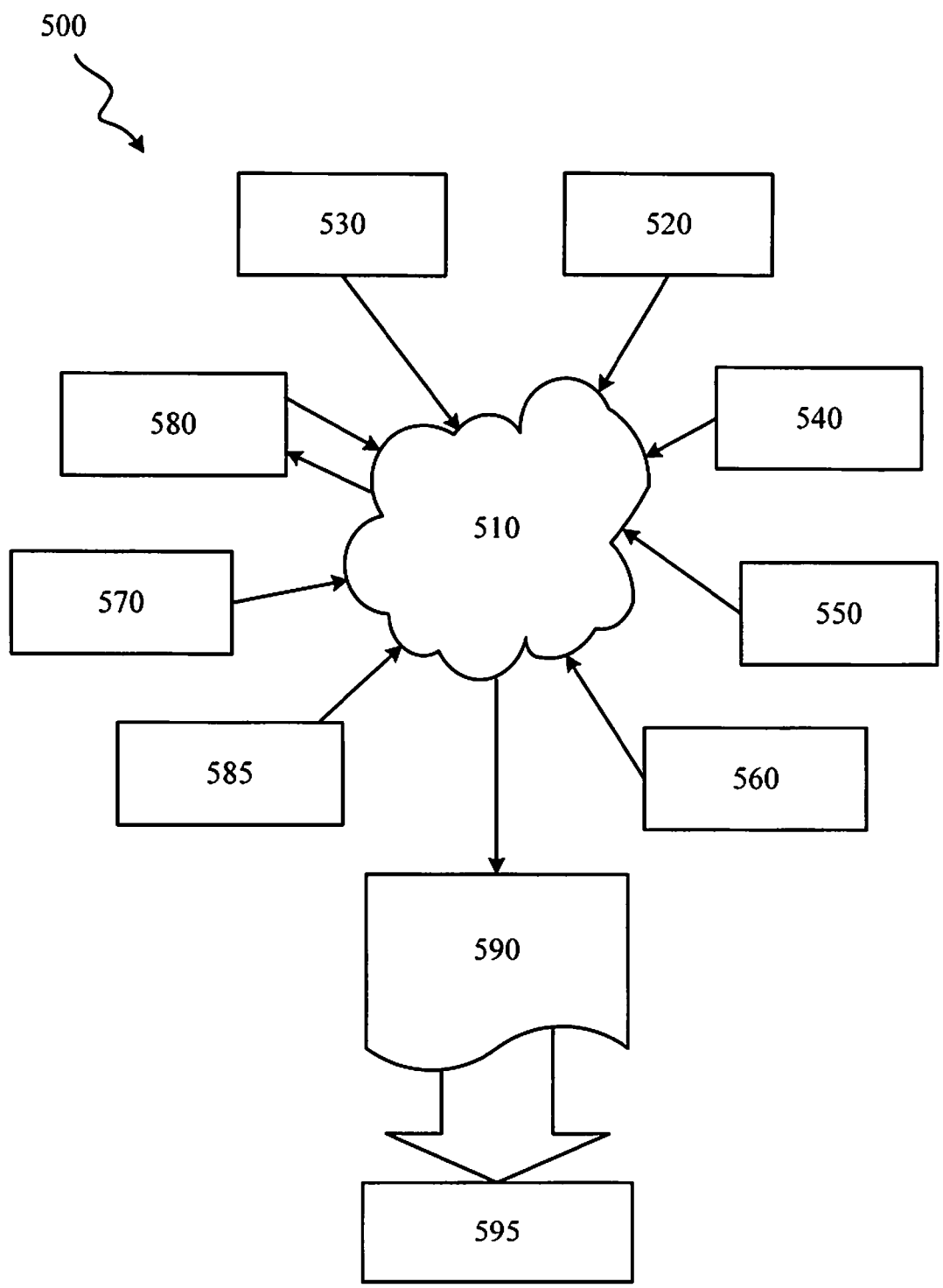
FIG. 5 is a flow diagram of a design process used in semiconductor design, manufacture, and/or test of the inventive SRAM depicted in FIG. 2 and FIG. 3, according to embodiments of the invention.

FIG. 5 illustrates multiple design structures 500 including an input design structure 520 that is preferably processed by a design process. Design structure 520 may be a logical simulation design structure generated and processed by design process 510 to produce a logically equivalent functional representation of a hardware device. Design structure 520 may alternatively include data or program instructions that, when processed by design process 510, generate a functional representation of the physical structure of a hardware device. Whether representing functional or structural design features, design structure 520 may be generated using electronic computer-aided design, such as that implemented by a core developer/designer. When encoded on a machine-readable data transmission, gate array, or storage medium, design structure 520 may be accessed and processed by one or more hardware or software modules within design process 510 to simulate or otherwise functionally represent an electronic component, circuit, electronic or logic module, apparatus, device, or system such as those shown in FIGS. 2 and 3. As such, design structure 520 may include files or other data structures including human or machine-readable source code, complied structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 510 preferably employs and incorporates hardware or software modules for synthesizing, translating, or otherwise processing a design/simulation functional equivalent of the components, circuits, devices, or logic structures shown in FIGS. 2 and 3 to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describe the connections to other elements and circuits in an integrated circuit design. Netlist 580 may be synthesized using an iterative process in which Netlist 580 is resynthesized one or more times depending on design specifications and parameters for the device. As with other design structure types described herein, Netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510, without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures, along with any additional mechanical design or data, to generate a second design structure 590. Design structure 590 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 2 and 3. In one embodiment, design structure 590 may comprise a compiled, executable HDL simulation model that functionally simulates the devices shown in FIGS. 2 and 3.

Design structure 590 may also employ a data format used for the exchange of layout data of integrated circuits and/or symbolic data format (e.g., information stored in a GDSII, GL1, OASIS, map files, or any other suitable format for storing such design data structures). Design structure 590 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2 and 3. Design structure 590 may then proceed to a state 595 where, for example, design structure 590 proceeds to tape-out, is released to manufacturing, is released to a mask house, is sent to another design house, is sent back to the customer, etc.

Although the present invention has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the invention.

What is claimed is:

1. An SRAM, comprising:
a first SRAM column having first SRAM cells coupled to a global bit line, a first local bit line coupled to the first SRAM cells and the global bit line, and a first local evaluation logic coupled to the global bit line, wherein the first SRAM column is selected with a first column select line, and wherein the first local evaluation logic includes:
  a first switch operated by the first local bit line and coupled to the global bit line;
  a second switch operated by the first column select line and coupled to the first switch and ground;
  a first write switch operated by a first write line, the first write line configured to operate the first write switch to charge the first local bit line to a write voltage;
  a second write switch operated by a first write enable line and coupled to the first local bit line and ground; and
  a first precharge switch operated by a first local bit line precharge line, the first local bit line precharge line configured to operate the first precharge switch to precharge the first local bit line; and
a second SRAM column having second SRAM cells coupled to the global bit line, a second local bit line coupled to the second SRAM cells and the global bit line, and a second local evaluation logic coupled to the global bit line, wherein the second SRAM column is selected with a second column select line, and wherein the second local evaluation logic includes:
  a third switch operated by the second local bit line and coupled to the global bit line;
  a fourth switch operated by the second column select line and coupled to the third switch and ground;
  a third write switch operated by a second write line, the second write line configured to operate the third write switch to charge the second local bit line to the write voltage;
  a fourth write switch operated by a second write enable line and coupled to the second local bit line and ground; and
  a second precharge switch operated by a second local bit line precharge line, the second local bit line precharge line configured to operate the second precharge switch to precharge the second local bit line to a precharge voltage.

2. The SRAM of claim 1, wherein only one of the first column select line and the second column select line is activated at one time.

3. The SRAM of claim 1, wherein the second column select line is the inverse of the first column select line.

4. The SRAM of claim 1, wherein:
- the first switch is a first transistor having a drain coupled to the global bit line and a gate coupled to the first local bit line;
- the second switch is a second transistor having a source coupled to ground, a drain coupled to the first transistor, and a gate coupled to the first column select line;
- the third switch is a third transistor having a drain coupled to the global bit line and a gate coupled to the second local bit line; and
- the fourth switch is a fourth transistor having a source coupled to ground, a drain coupled to the third transistor, and a gate coupled to the second column select line.

\* \* \* \* \*